US012726199B2

(12) United States Patent
Sugawara

(10) Patent No.: US 12,726,199 B2
(45) Date of Patent: Sep. 1, 2026

(54) SWITCHING CONTROL CIRCUIT AND SEMICONDUCTOR DEVICE

(71) Applicant: FUJI ELECTRIC CO., LTD., Kawasaki (JP)

(72) Inventor: Takato Sugawara, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 49 days.

(21) Appl. No.: 19/002,299

(22) Filed: Dec. 26, 2024

(65) Prior Publication Data

US 2025/0266837 A1 Aug. 21, 2025

(30) Foreign Application Priority Data

Feb. 16, 2024 (JP) ................................ 2024-022305

(51) Int. Cl.
*H03K 19/0185* (2006.01)
*H03K 17/16* (2006.01)

(52) U.S. Cl.
CPC ... *H03K 19/018521* (2013.01); *H03K 17/162* (2013.01); *H03K 2217/0063* (2013.01); *H03K 2217/0072* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 9,350,352 | B2 * | 5/2016 | Koike | H03K 19/018521 |
| 9,502,955 | B2 * | 11/2016 | Ohashi | H03K 17/162 |
| 11,201,536 | B2 * | 12/2021 | Akahane | H02M 1/08 |
| 2020/0235763 | A1 | 7/2020 | Ito et al. | |
| 2021/0152075 | A1 | 5/2021 | Akahane | |

FOREIGN PATENT DOCUMENTS

| | | |
|---|---|---|
| JP | 2019-079372 A | 5/2019 |
| JP | 2021-083072 A | 5/2021 |

* cited by examiner

*Primary Examiner* — Cassandra F Cox
(74) *Attorney, Agent, or Firm* — Rabin & Berdo, P.C.

(57) ABSTRACT

A switching control circuit, including: a signal output circuit outputting a set signal and a reset signal, to turn on and off the first switching device, in response to an input signal reaching a first logic level and a second logic level, respectively; a level shifter circuit shifting a level of each of the set and reset signals; a first driver circuit driving the first switching device; a power supply circuit generating a second power supply voltage based on a first power supply voltage; and a detection circuit detecting that the first power supply voltage, after dropping from a first level, has risen to a second level. The signal output circuit outputs the reset signal in response to an output of the detection circuit. The set and reset signal change their levels according to the second power supply voltage. The level shifter circuit identifies the generated reset signal.

10 Claims, 9 Drawing Sheets

SWITCHING CONTROL CIRCUIT AND SEMICONDUCTOR DEVICE

CROSS-REFERENCE TO RELATED APPLICATIONS

The present application claims priority pursuant to 35 U.S.C. § 119 from Japanese patent application number 2024-022305 filed on Feb. 16, 2024, the entire disclosure of which is hereby incorporated by reference herein.

BACKGROUND

Technical Field

The present disclosure relates to a switching control circuit and a semiconductor device.

Description of the Related Art

A switching control circuit controls a half-bridge circuit including a high-side switching device and a low-side switching device. The switching control circuit includes a signal output circuit, a level shifter circuit, and a driver circuit. The signal output circuit outputs a pulse to switch the high-side switching device. The level shifter circuit receives the pulse and outputs a resultant signal as a set signal and a reset signal, to thereby control the driver circuit that drives the high-side switching device (for example, Japanese Patent Application Publication No. 2021-083072).

Meanwhile, when a power supply voltage drops, a pulse with a lowered voltage level will be outputted from the signal output circuit, and the level shifter circuit may result in being unable to detect the pulse signal correctly. In such a case, the signal output circuit may result in being unable to safely control the switching of the switching device.

SUMMARY

A first aspect of the present disclosure is a switching control circuit for controlling a first switching device, the switching control circuit comprising: a signal output circuit configured to output a set signal to turn on the first switching device, in response to a logic level of an input signal of the switching control circuit reaching a first logic level, and output a reset signal to turn off the first switching device, in response to the logic level of the input signal reaching a second logic level; a level shifter circuit configured to shift a level of each of the set signal and the reset signal; a first driver circuit configured to drive the first switching device, in response to an output from the level shifter circuit; a power supply circuit configured to generate a second power supply voltage for the signal output circuit, based on a first power supply voltage; and a detection circuit configured to detect that the first power supply voltage, after dropping from a first level, has risen to a second level, wherein the signal output circuit is configured to output the reset signal, in response to the first power supply voltage being restored to the second level after dropping from the first level, when the logic level of the input signal is the second logic level, the level of each of the set signal and the reset signal changes according to the level of the second power supply voltage, and the level shifter circuit is configured to identify the reset signal upon the reset signal being outputted when the first power supply voltage is at or above the second level.

Further, a second aspect of the present disclosure is a semiconductor device comprising: a first switching device and a second switching device, and a switching control circuit configured to control switching of the first switching device and the second switching device, the switching control circuit including a signal output circuit configured to output a set signal to turn on the first switching device, in response to a logic level of an input signal of the switching control circuit reaching a first logic level, and output a reset signal to turn off the first switching device, in response to the logic level of the input signal reaching a second logic level, a level shifter circuit configured to shift a level of each of the set signal and the reset signal, a first driver circuit configured to drive the first switching device, in response to an output from the level shifter circuit, a power supply circuit configured to generate a second power supply voltage for the signal output circuit, based on a first power supply voltage, and a detection circuit configured to detect that the first power supply voltage, after dropping from a first level, has risen to a second level, wherein the signal output circuit is configured to output the reset signal, in response to the first power supply voltage being restored to the second level after dropping from the first level, when the logic level of the input signal is the second logic level, the level of each of the set signal and the reset signal changes according to the level of the second power supply voltage, and the level shifter circuit is configured to identify the reset signal upon the reset signal being outputted when the first power supply voltage is at or above the second level.

DETAILED DESCRIPTION

At least following matters will become apparent from the descriptions of the present description and the accompanying drawings.

Embodiment

Figure 1:
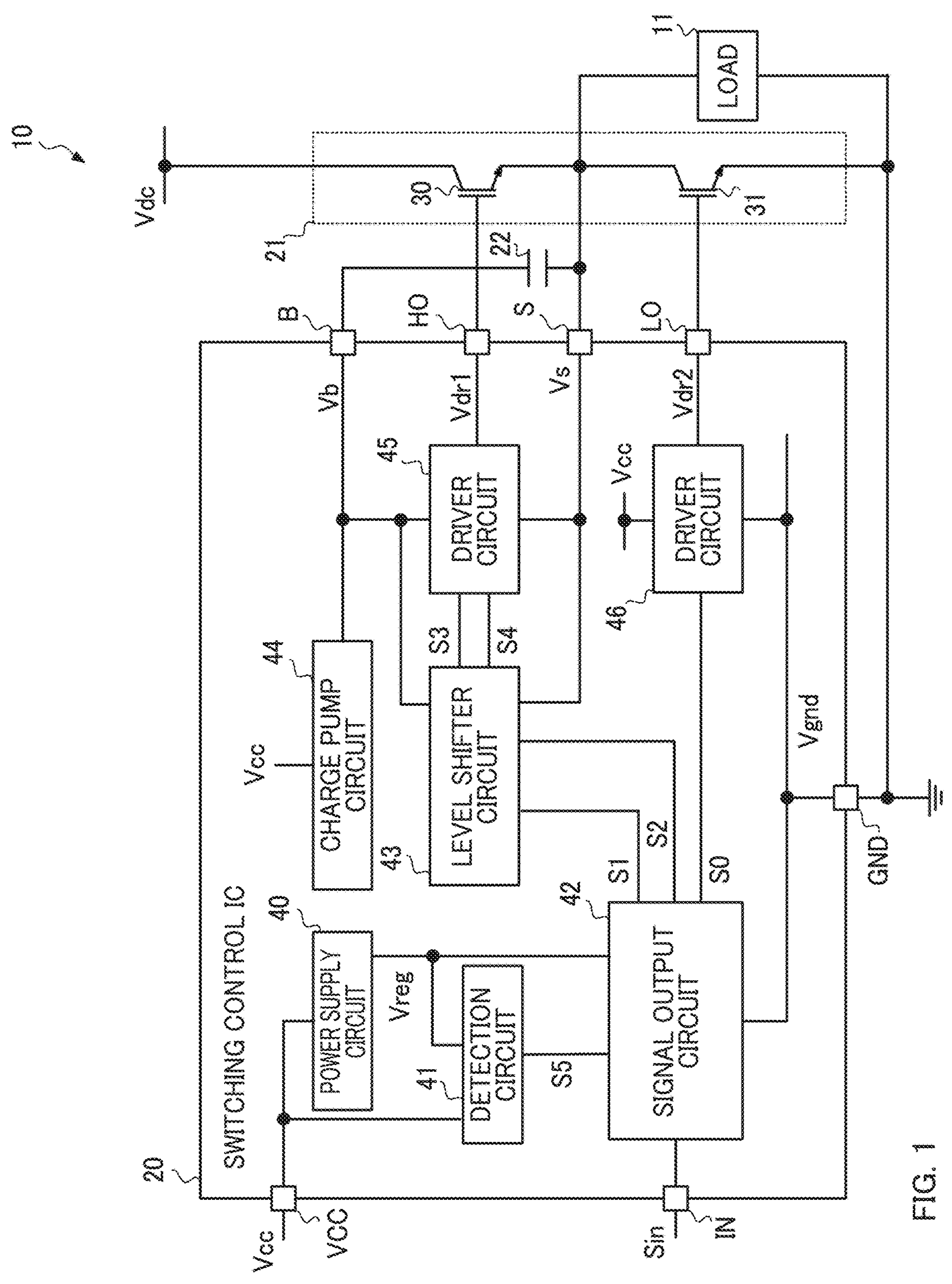
FIG. 1 is a diagram illustrating an example of a power module 10.

FIG. 1 is a diagram illustrating a configuration of a power module 10 according to an embodiment of the present disclosure. The power module 10 is a semiconductor device that drives a load 11 in response to an instruction from a microcomputer (not illustrated), and includes a switching control integrated circuit (IC) 20, a half-bridge circuit 21, and a capacitor 22.

The switching control IC 20 is a high voltage integrated circuit (HVIC) that controls an operation of the half-bridge circuit 21 in response to an input signal Sin from the microcomputer (not illustrated). The switching control IC 20 has terminals VCC, IN, GND, B, S, HO, and LO, and details of the switching control IC 20 will be described later.

The half bridge circuit 21 drives a motor coil of an air conditioner, which is the load 11, for example, and includes an insulated gate bipolar transistor (IGBT) 30 and an IGBT 31.

The IGBT 30 is a high-side switching device having a gate electrode connected to a terminal HO, an emitter electrode connected to a terminal S, and a collector electrode to receive a predetermined voltage Vdc (for example, "400 V").

The IGBT 31 is a low-side switching device having a gate electrode connected to a terminal LO, a collector electrode connected to the terminal S, and an emitter electrode that is grounded.

In an embodiment of the present disclosure, an IGBT is used as a switching device, however, for example, a metal-oxide-semiconductor (MOS) transistor or a bipolar transistor may be used. Further, the IGBT 30 corresponds to a "first switching device on a power supply side", and the IGBT 31 corresponds to a "second switching device on a ground side".

The capacitor 22 has one end connected to a terminal B, and the other end connected to the terminal S. The capacitor 22 is charged with a bootstrap voltage Vb from a charge pump circuit 44, which will be described later, being applied to the terminal B. As a result, the bootstrap voltage Vb is generated across the capacitor 22. Note that the bootstrap voltage Vb is used to turn on the high-side IGBT 30.

For example, when a voltage Vs at the terminal S is "0 V", the IGBT 30 is turned on in response to the voltage at the gate electrode of the IGBT 30 exceeding a threshold voltage of the IGBT 30. However, in response to the IGBT 30 being turned on, the voltage Vs at the terminal S approaches the voltage Vdc (for example, "400 V"), and thus, in order to keep the IGBT 30 on, the IGBT 30 needs to be driven with reference to the voltage Vs at the terminal S to which the emitter electrode of the IGBT 30 is connected.

In an embodiment of the present disclosure, with reference to the voltage Vs at the terminal S, a voltage higher than the voltage Vs by an amount corresponding to the bootstrap voltage Vb is generated at the terminal B. Accordingly, the switching control IC 20 can turn on the IGBT 30 by using the bootstrap voltage Vb, and details thereof will be described later.

<<<Configuration of Switching Control IC 20>>>

The switching control IC 20 includes a power supply circuit 40, a detection circuit 41, a signal output circuit 42, a level shifter circuit 43, the charge pump circuit 44, and driver circuits 45, 46.

The power supply circuit 40 generates a power supply voltage Vreg that is used inside the switching control IC 20, based on a power supply voltage Vcc (for example, "20 V") applied to the terminal VCC. Note that the power supply circuit 40 according to an embodiment of the present disclosure is configured to generate the power supply voltage Vreg which is stable even when the IGBT 31 is also turned on. The power supply voltage Vcc corresponds to a "first power supply voltage", and the power supply voltage Vreg corresponds to a "second power supply voltage".

<<<Example of Power Supply Circuit 40>>>

Figure 2:
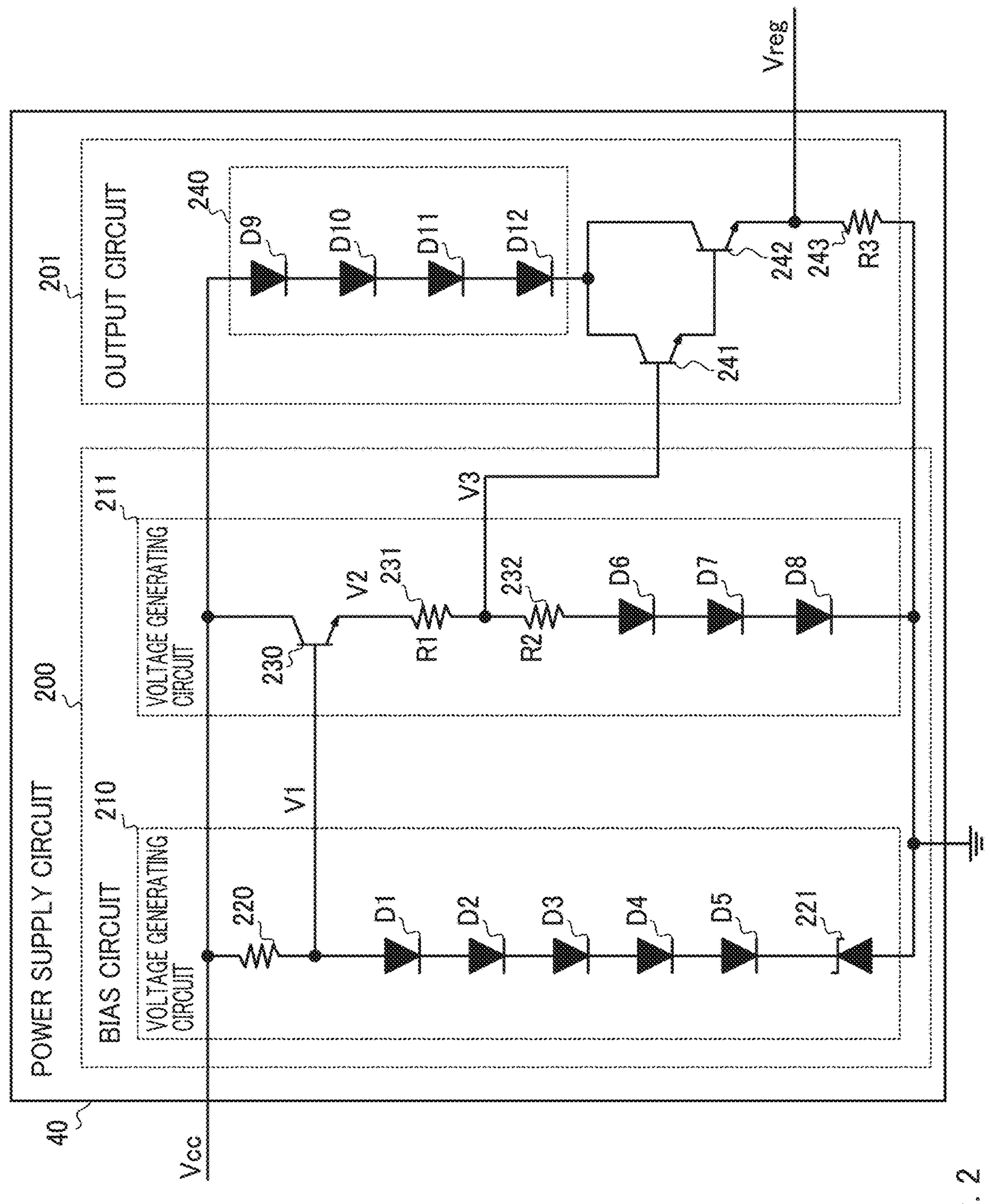
FIG. 2 is a diagram illustrating an example of a power supply circuit 40.

FIG. 2 is a diagram illustrating an example of a power supply circuit 40. The power supply circuit 40 generates a temperature-compensated power supply voltage Vreg (for example, "5 V"), based on the power supply voltage Vcc. The power supply circuit 40 includes a bias circuit 200 and an output circuit 201.

The bias circuit 200 generates a bias voltage V3 to operate a Darlington-connected transistor (described later). The bias circuit 200 includes voltage generating circuits 210, 211.

The voltage generating circuit 210 is a circuit that generates a voltage V1 at a predetermined level, and includes a resistor 220, five diodes D1 to D5, and a Zener diode 221.

The resistor 220, the diodes D1 to D5, and the Zener diode 221 are connected in series. Thus, in response to the power supply Vcc being applied to one end of the resistor 220, the voltage V1 at the node at which the other end of the resistor 220 and the anode of the diode D1 are connected is given by an expression (1) as follows:

$$V1 = Vz + 5 \times Vf \tag{1}$$

where "Vz" is the breakdown voltage of the Zener diode 221, and "Vf" is the forward voltage of the diodes D1 to D5.

The voltage generating circuit 211 is a circuit that generates a bias voltage V3, and includes an NPN transistor 230, resistors 231, 232, and three diodes D6 to D8.

The NPN transistor 230 has a base electrode to receive the voltage V1, and an emitter electrode to which the diodes D6 to D8 are connected through the resistors 231, 232. Thus, a voltage V2 given by an expression (2) below is outputted from the emitter electrode of the NPN transistor 230, $$V2 = V1 - Vbe = Vz + 5 \times Vf - Vbe \tag{2}$$

where "Vbe" is the base-emitter voltage of the NPN transistor 230. In the voltage generating circuit 211, a voltage difference between the forward voltage "3×Vf" of the three diodes D6 to D8 and the voltage V2 is divided by a voltage divider circuit constituted by the resistors 231, 232. Thus, the bias voltage V3 from a node at which the resistors 231 and 232 are connected is given by an expression (3) as follows:

$$\begin{aligned} V3 &= 3 \times Vf + (V2 - 3 \times Vf) \times (R2/(R1 + R2)) \\ &= 3 \times Vf + (Vz + 2 \times Vf - Vbe) \times (R2/(R1 + R2)) \end{aligned} \tag{3}$$

where "R1" is a resistance value of the resistor 231, and "R2" is a resistance value of the resistor 232.

The output circuit 201 is a circuit that outputs the predetermined power supply voltage Vreg, based on the bias voltage V3, and includes a withstand voltage circuit 240, the NPN transistors 241, 242, and a resistor 243.

The withstand voltage circuit 240 is a circuit that protects the NPN transistors 241, 242 from an overvoltage, and includes four diodes D9 to D12 connected in series.

The emitter electrode of the NPN transistor 241 is connected to the base electrode of the NPN transistor 242, and the collector electrode of the NPN transistor 241 is connected to the collector electrode of the NPN transistor 242. Accordingly, the NPN transistors 241, 242 according to an embodiment of the present disclosure are darlington-connected, and thus can drive a larger load.

As described above, the voltage V3 is applied to the base electrode of the NPN transistor 241 in a first stage, and thus the power supply voltage Vreg given by an expression (4) below is outputted from the emitter electrode of the NPN transistor 242.

$$Vreg = V3 - 2 \times Vbe = (3 \times (Vz + 2 \times Vf - Vbe) \times (R2/(R1+R2)) - 2 \times Vbe \quad (4)$$

The resistor 243 is an element to steadily generate the power supply voltage Vreg. Specifically, when the resistor 243 is not provided, the current flowing through the NPN transistors 241, 242 reaches zero, in response to the load of the power supply circuit 40 becoming no load state. Thus, the generation of the power supply voltage Vreg is stopped.

Then, if the current starts flowing through the load of the power supply circuit 40 from this state, it takes time for the power supply circuit 40 to generate the power supply voltage Vreg.

In an embodiment of the present disclosure, even when the load of the power supply circuit 40 is in no load state, the current continues flowing through the resistor 243. Thus, the power supply circuit 40 can steadily generate the predetermined power supply voltage Vreg, irrespective of the state of the load of the power supply circuit 40.

Further, the temperature coefficient of the breakdown voltage "Vz" of the Zener diode 221 is positive, and the temperature coefficient of the forward voltage "Vf" of the diodes D1 to D12 is negative. The temperature coefficient of the base-emitter voltage "Vbe" is negative.

In an embodiment of the present disclosure, the same type of resistors (for example, polysilicon) with the same temperature coefficient are used as the resistors 231, 232. Accordingly, the temperature coefficient of the term "R2/(R1+R2)" in the expression (4) can be substantially ignored.

In an embodiment of the present disclosure, for example, the number of the diodes D1 to D12 is adjusted based on the expression (4) such that the power supply voltage Vreg is temperature-compensated. This causes the level of the power supply voltage Vreg to be constant, irrespective of the temperature. In an embodiment of the present disclosure, it is possible to cause the power supply voltage Vreg to be at a desired level by changing the resistance ratio of the resistors 231, 232.

As such, the power supply circuit 40 includes the darlington-connected NPN transistors 241, 242, and thus the output current capability is high. Further, the power supply circuit 40 can output the temperature-compensated power supply voltage Vreg at a predetermined level (for example, "5 V").

<<<<Example of Voltage Change in Power Supply Voltages Vcc, Vreg>>>

Figure 3:
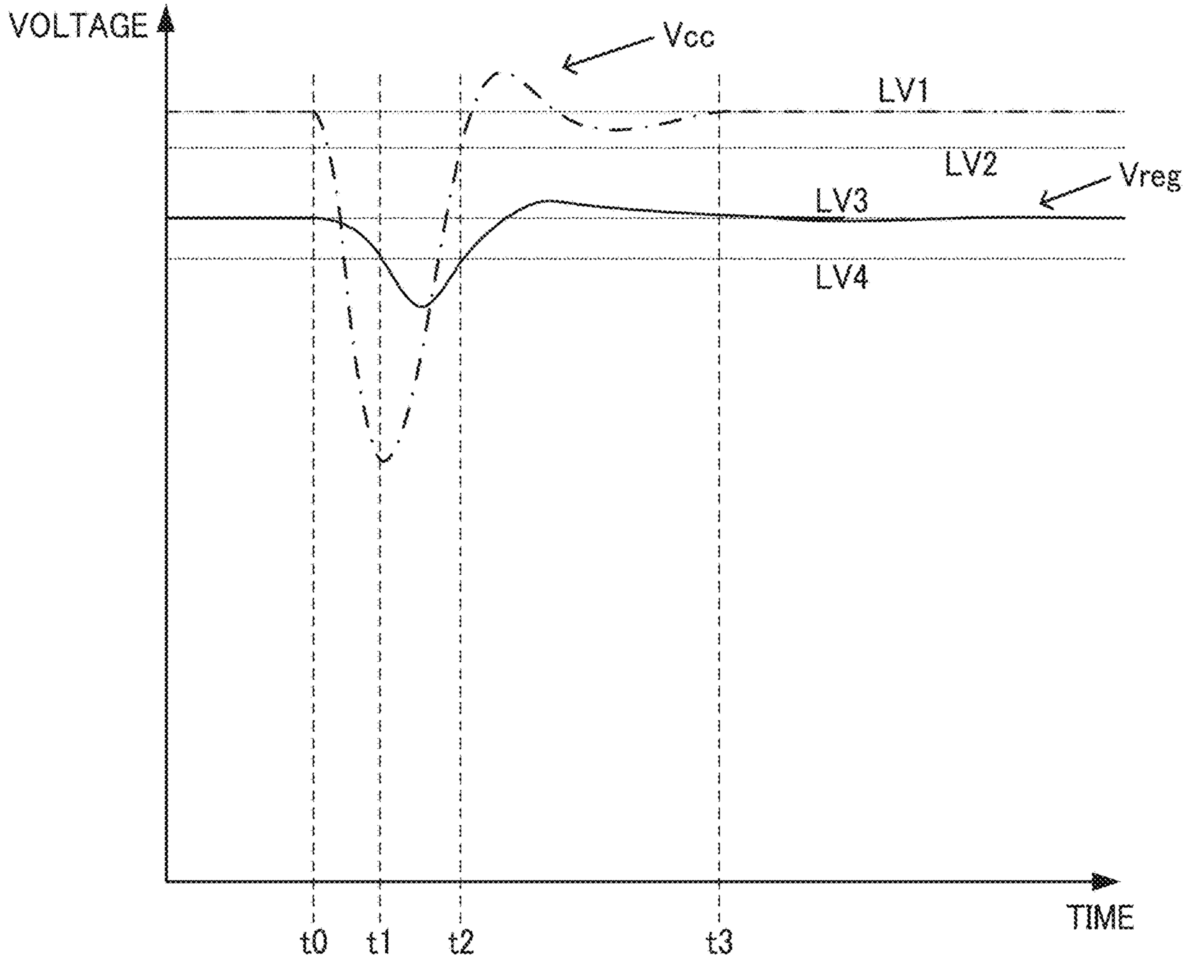
FIG. 3 is a diagram illustrating an example of change in voltages when power supply voltages Vcc, Vreg are restored.

FIG. 3 is a diagram illustrating the voltage change in the power supply voltages Vcc, Vreg after the power supply voltage Vcc drops. Note that the dashed-dotted line indicates the power supply voltage Vcc, and the solid line indicates the power supply voltage Vreg.

In time t0, in response to the power supply voltage Vcc dropping from the first level LV1, the power supply voltage Vreg also starts to drop from the third level LV3, and in response to the power supply voltage Vcc dropping to its lowest at time t1 and starting to be restored, the power supply voltage Vreg also starts to be restored afterwards.

At time t2, the power supply voltage Vcc is the restored to a second level LV2. In this event, the power supply voltage Vcc has risen to a level at which the power supply circuit 40 can generate the power supply voltage Vreg, however, the power supply voltage Vcc has not yet restored to the level before its dropping.

At time t3, the power supply voltage Vcc is restored to the level before its dropping. Before the power supply voltage Vcc is restored to the level before its dropping as such, the power supply circuit 40 according to an embodiment of the present disclosure starts to output the power supply voltage Vreg at a fourth level LV4.

<<<<Example of Detection Circuit 41>>>

The detection circuit 41 in FIG. 1 detects that the power supply voltage Vcc has risen to the second level LV2 after the power supply voltage Vcc drops. Specifically, the detection circuit 41 outputs a pulse signal S5 in response to the power supply voltage Vcc rising to the second level LV2 after dropping from the first level LV1.

Figure 4:
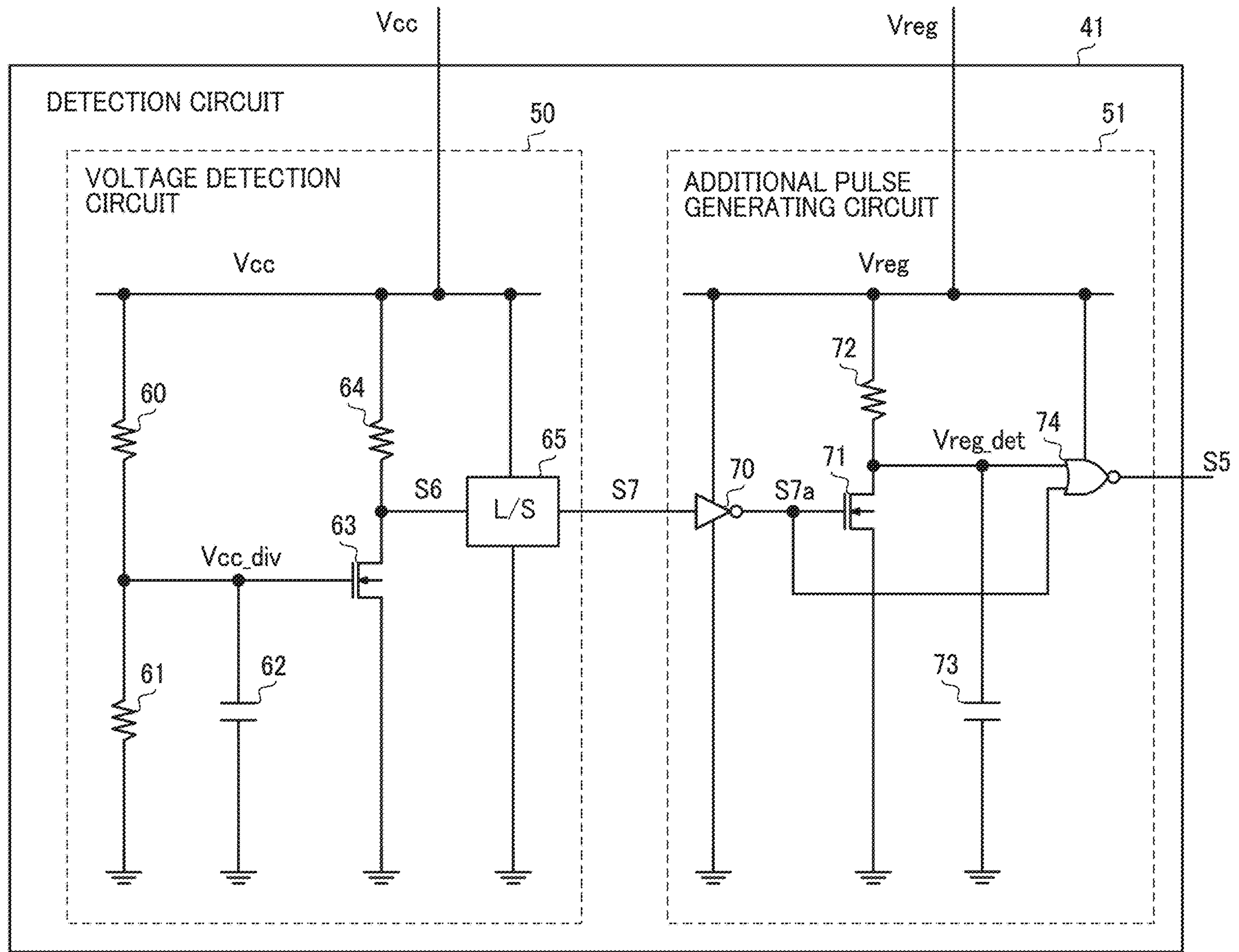
FIG. 4 is a diagram illustrating an example of a detection circuit 41.

As illustrated in FIG. 4, the detection circuit 41 includes a voltage detection circuit 50 and an additional pulse generating circuit 51. The voltage detection circuit 50 is a circuit that detects that the power supply voltage Vcc has dropped, and outputs a signal S7 corresponding to the power supply voltage Vcc, in response to the power supply voltage Vcc being restored after its dropping. Note that the additional pulse generating circuit 51 corresponds to a "pulse generating circuit".

The voltage detection circuit 50 includes resistors 60, 61, 64, a capacitor 62, an N-channel metal-oxide-semiconductor (NMOS) transistor 63, and a level shifter circuit 65.

The resistors 60, 61 configure a voltage divider circuit that divides the power supply voltage Vcc, to thereby generate a voltage Vcc_div at a connection point. The capacitor 62 is an element that stabilizes the voltage Vcc_div, and delays the time for the NMOS transistor 63 to be turned on after the power supply voltage Vcc is restored.

The NMOS transistor 63 is an element that detects the level of the power supply voltage Vcc, and has a gate electrode to receive the voltage Vcc_div, a drain electrode to receive the power supply voltage Vcc through the resistor 64, and a source electrode that is grounded. In response to the voltage Vcc_div exceeding a threshold value Vthnm and the NMOS transistor 63 being turned on, the NMOS transistor 63 generates a signal S6 at the ground voltage level, and in response to the voltage Vcc_div dropping below the threshold value Vthnm and the NMOS transistor 63 being turned off, the voltage level of the signal S6 reaches the level corresponding to the power supply voltage Vcc.

The level shifter circuit 65 level-shifts the signal S6 at the level of the power supply voltage Vcc to a signal S7 at the level of the power supply voltage Vreg.

The additional pulse generating circuit 51 generates the pulse signal S5 which results in a set signal S1 or a reset signal S2 in response to the power supply voltage Vcc being restored. Specifically, the additional pulse generating circuit 51 generates the pulse signal S5, in response to the power supply voltage Vcc being restored to the second level LV2 after dropping, based on the power supply voltage Vreg and the signal S7. The additional pulse generating circuit 51 includes an inverter circuit 70, an NMOS transistor 71, a resistor 72, a capacitor 73, and a NOR circuit 74.

The inverter circuit 70 outputs a signal S7*a* at a level corresponding to the power supply voltage Vreg, in response to the voltage level of the signal S7 exceeding a threshold value Vthiv, and outputs the signal S7*a* at the ground voltage level, in response to the voltage level of the signal S7 dropping below the threshold value Vthiv.

The NMOS transistor 71 is an element that controls the charging and discharging of the capacitor 73, and has a gate electrode to receive the signal S7*a*, a drain electrode to receive the power supply voltage Vreg through the resistor 72, and a source electrode that is grounded. Specifically, in response to turning on of the NMOS transistor 71, the capacitor 73 is discharged, and in response to turning off of the NMOS transistor 71, the capacitor 73 is charged with the power supply voltage Vreg through the resistor 72. Note that the voltage generated in the capacitor 73 is defined as a voltage Vreg_det.

The NOR circuit 74 outputs the pulse signal S5, based on the voltage Vreg_det and the signal S7*a*. Specifically, in response to the voltage level of the voltage Vreg_det or the signal Sa exceeding the threshold value Vthnor, the NOR circuit 74 outputs a low pulse signal S5, and in response to the voltage levels of the voltage Vreg_det and the signal S7*a* dropping below the threshold value Vthnor, the NOR circuit 74 outputs a high pulse signal S5.

<<<Example of Detection Circuit 41>>>

Figure 5:
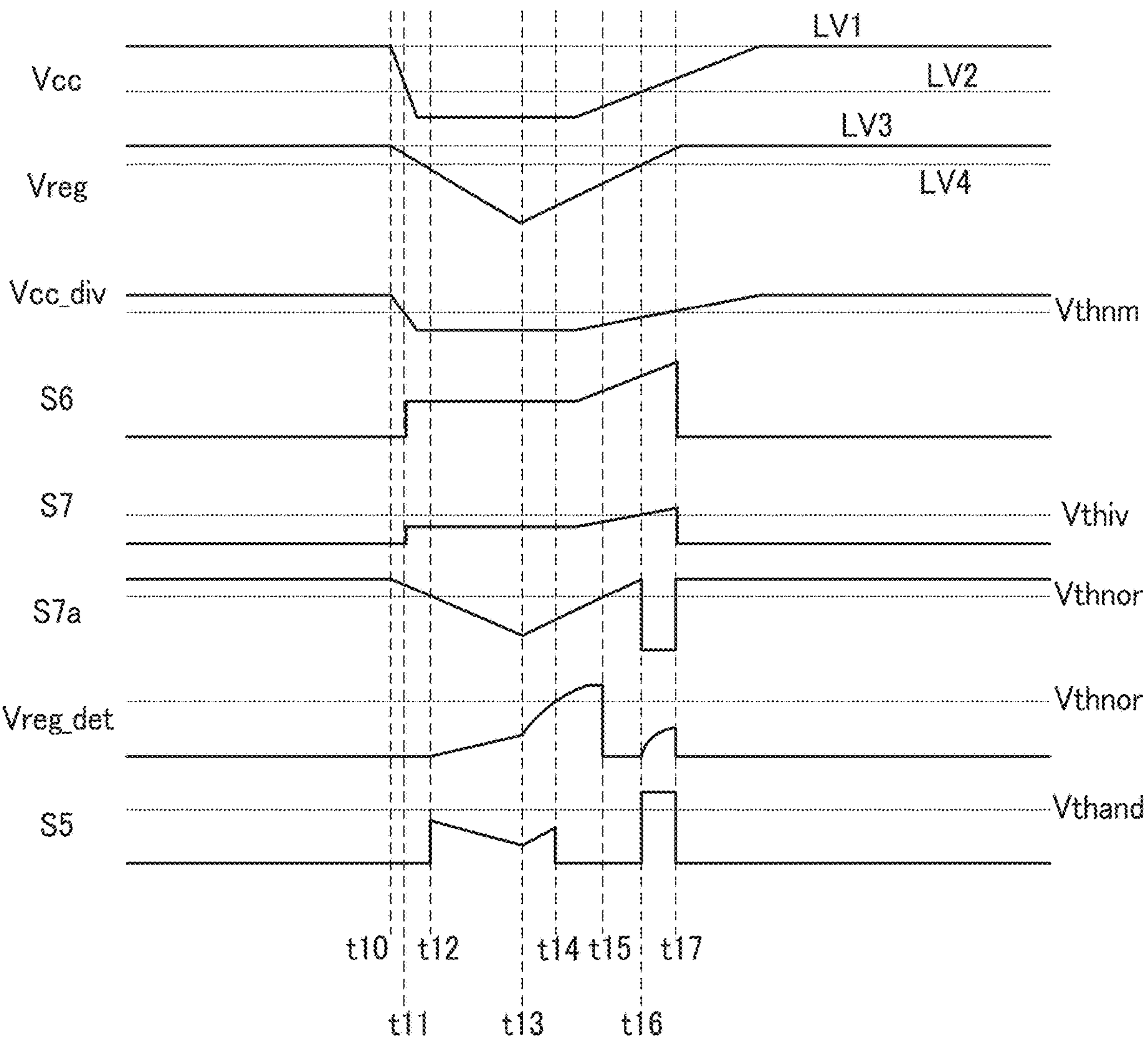
FIG. 5 is a diagram illustrating an example of a detection circuit 41.

FIG. 5 is a diagram illustrating an example of an operation of the detection circuit 41. At time t10, the power supply voltage Vcc starts to drop.

At time t11, in response to the voltage Vcc_div reaching a voltage at which the NMOS transistor 63 is turned off, the signal S6 reaches a voltage corresponding to the voltage level of the power supply voltage Vcc. As a result, the voltage level of the signal S7 reaches the level corresponding to the signal S6, but does not reach the threshold value Vthiv of the inverter circuit 70.

Further, the voltage level of the signal S7*a* reaches the level corresponding to the voltage level of the power supply voltage Vreg. However, since it is higher than the threshold value Vthnor of the NOR circuit 74 and does not reach the level at which the NMOS transistor 71 is turned off, the voltage level of voltage Vreg_det is the ground voltage level. Accordingly, the voltage level of the signal S5 is the ground voltage level.

At time t12, in response to the voltage level of the signal S7*a* dropping below the threshold value Vthnor, the NMOS transistor 71 is turned off, the capacitor 73 is charged with the power supply voltage Vreg, and the voltage level of the voltage Vreg_det reaches the level corresponding to the voltage level of the power supply voltage Vreg. Note that in this event, the NOR circuit 74 outputs the signal S5 at the level corresponding to the voltage level of the power supply voltage Vreg.

At time t13, the power supply voltage Vreg starts to be restored, and the capacitor 73 is charged with the power supply voltage Vreg.

At time t14, in response to the voltage Vreg_det exceeding the threshold value Vthnor of the NOR circuit 74, the voltage level of the signal S7*a* is still lower than the threshold value Vthnor, and thus the NOR circuit 74 outputs the signal S5 at the ground voltage level.

At time t15, in response to the voltage level of the signal S7*a* reaching the level at which the NMOS transistor 71 is turned on with a rise in the power supply voltage Vreg, the capacitor 73 is discharged and the voltage Vreg_det reaches the ground voltage level. However, since the voltage level of the signal S7*a* is higher than the threshold value Vthnor, the NOR circuit 74 outputs the signal S5 at the ground voltage level.

At time t16, in response to the power supply voltage Vcc being restored to the second level LV2 and the voltage level of the signal S7 exceeding the threshold value Vthiv, the voltage level of the signal S7*a* reaches the ground voltage level. This causes the NMOS transistor 71 to be turned off and the capacitor 73 to start to be charged.

However, since the voltage levels of the voltage Vreg_det and the signal S7*a* are lower than the threshold value Vthnor, the NOR circuit 74 outputs the signal S5 at the level corresponding to the voltage level of the power supply voltage Vreg. Accordingly, the detection circuit 41 outputs the pulse signal S5, in response to the power supply voltage Vcc being restored to the second level LV2 after dropping from the first level LV1.

Further, in response to the power supply voltage Vcc being restored to the second level LV2, the voltage level of the power supply voltage Vreg exceeds the threshold value Vthnm of the NMOS transistors 100, 103 (described later) in the level shifter circuit 43 in FIG. 8. In association therewith, the voltage levels of the set pulse signal S1 and the reset pulse signal S2 outputted by the output circuit 83 (described later) in FIG. 7, which operates based on the power supply voltage Vreg, also exceed the threshold value Vthnm, and thus the level shifter circuit 43 becomes able to identify the set pulse signal S1 and the reset pulse signal S2.

At time t17, in response to the voltage level of the voltage Vcc_div corresponding to the power supply voltage Vcc exceeding the threshold value Vthnm of the NMOS transistor 63, the voltage levels of the signals S6, S7 reach the ground voltage level, and the NMOS transistor 71 is turned on. Then, the voltage Vreg_det reaches the ground voltage level, however, the voltage level of the signal S7*a* is higher than the threshold value Vthnor, and thus the NOR circuit 74 outputs the pulse signal S5 at the ground voltage level.

The signal output circuit 42 in FIG. 1 outputs a signal to control switching of the IGBTs 30, 31, in response to the input signal Sin of a logic level that is inputted through the terminal IN. Specifically, in response to the input signal Sin, the signal output circuit 42 outputs the set pulse signal S1 to turn on the high-side IGBT 30, the reset pulse signal S2 to turn off the IGBT 30, and a control signal S0 to control switching of the low-side IGBT 31.

<<<<Example of Signal Output Circuit 42>>>

Figure 6:
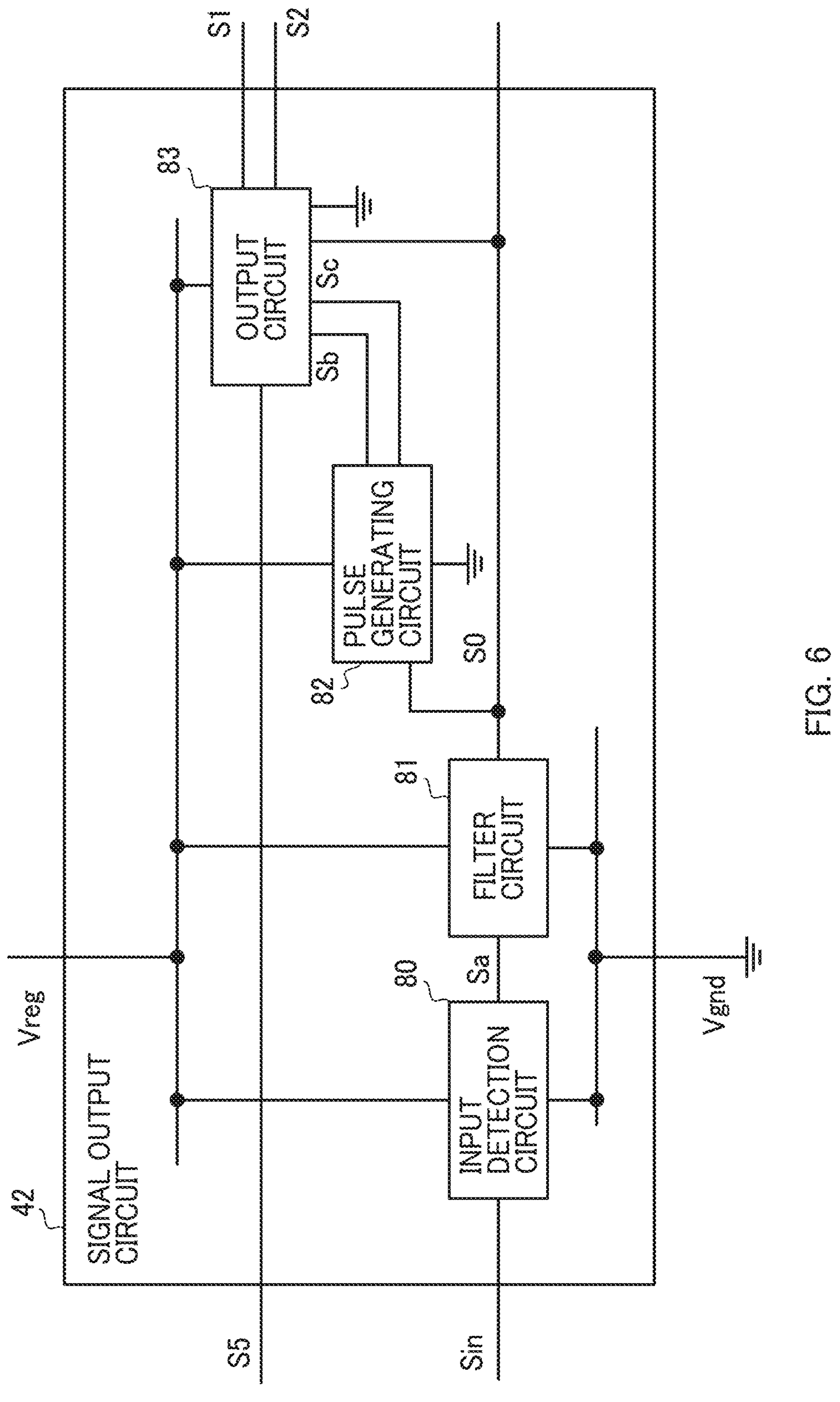
FIG. 6 is a diagram illustrating an example of a signal output circuit 42.

As illustrated in FIG. 6, the signal output circuit 42 includes an input detection circuit 80, a filter circuit 81, a pulse generating circuit 82, and an output circuit 83. Note that the input detection circuit 80, the filter circuit 81, the pulse generating circuit 82, and the output circuit 83 operate based on the power supply voltage Vreg of the power supply circuit 40 with reference to a ground voltage Vgnd. Thus, respective nodes for grounding of the input detection circuit 80, the filter circuit 81, the pulse generating circuit 82, and the output circuit 83 are connected to a grounded terminal GND.

The input detection circuit 80 detects the level of the input signal Sin and outputs a signal Sa at the same logic level as the logic level of the input signal Sin. Specifically, in response to the input signal Sin reaching a high level (hereinafter, referred to as high or high level), the input detection circuit 80 outputs the high signal Sa, and in response to the input signal Sin reaching a low level (hereinafter, referred to as low or low level), the input detection circuit 80 outputs the low signal Sa. Note that the input detection circuit 80 includes comparator (not illustrated), for example. Further, the high level corresponds to a “first logic level”, and the low level corresponds to a “second logic level”.

The filter circuit 81 is a low-pass filter to remove high-frequency noise of the signal Sa, and includes an operational amplifier (not illustrated) and the like, for example. The filter circuit 81 according to an embodiment of the present disclosure outputs a signal obtained by removing the noise from the signal Sa, as the control signal S0.

The pulse generating circuit 82 outputs a set pulse signal Sb and a reset pulse signal Sc, based on a change point of the control signal S0. Specifically, in response to the control signal S0 going high from low, the pulse generating circuit 82 outputs the high set pulse signal Sb, and in response to the control signal so going low from high, the pulse generating circuit 82 outputs the high reset pulse signal Sc. Note that each of the set pulse signal Sb and the reset pulse signal Sc according to an embodiment of the present disclosure is a pulse signal whose amplitude level changes in a range from 0 V to the level of the power supply voltage Vreg (for example, 5 V).

When the power supply voltage Vcc is at the first level LV1, the output circuit 83 outputs the set pulse signal S1 and the reset pulse signal S2, based on the set pulse Sb and the reset pulse Sc. Meanwhile, in response to the power supply voltage Vcc being restored to the second level after its dropping, the output circuit 83 outputs the pulse signal S5 from the detection circuit 41 as the set pulse signal S1 or the reset pulse signal S2, based on the control signal S0. Specifically, upon receiving the set pulse signal Sb, the output circuit 83 outputs the set pulse signal S1, and upon receiving the reset pulse signal Sc, the output circuit 83 outputs the reset pulse signal S2.

Further, as will be described later in detail, the output circuit 83 outputs the pulse signal S5 as the set pulse signal S1 upon receiving the pulse signal S5 when the control signal S0 is high. Meanwhile, the output circuit 83 outputs the pulse signal S5 as the reset pulse signal S2 upon receiving the pulse signal S5 when the control signal S0 is low.

<<<Example of Output Circuit 83>>>

Figure 7:
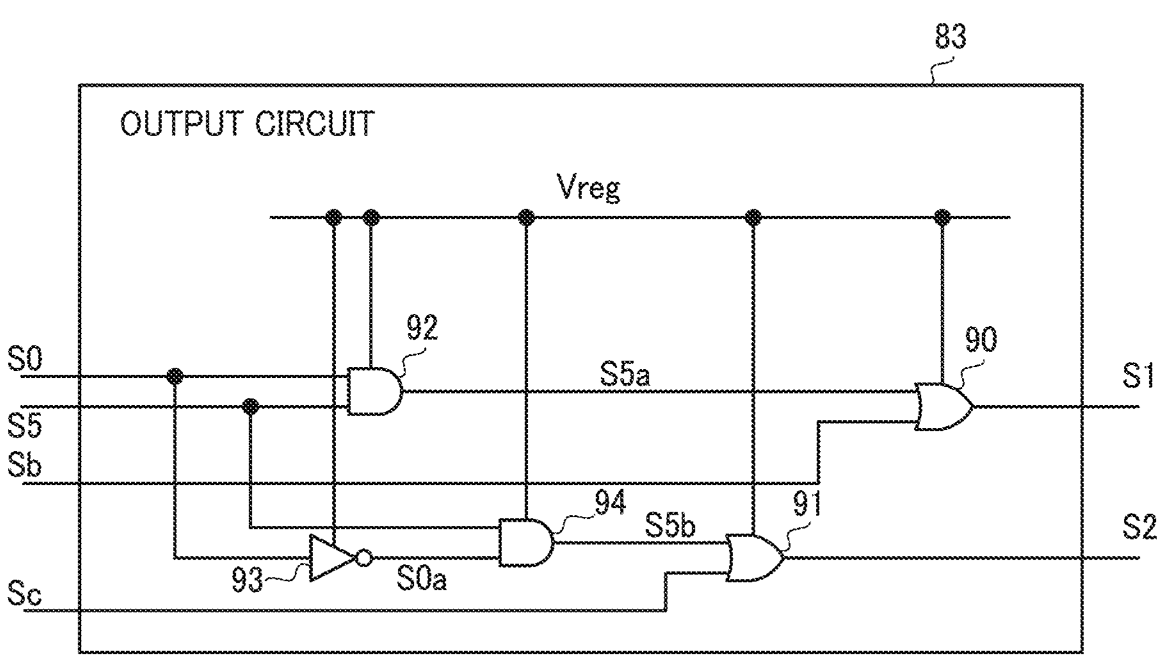
FIG. 7 is a diagram illustrating an example of an output circuit 83.

As illustrated in FIG. 7, the output circuit 83 includes OR circuits 90, 91, AND circuits 92, 94, and an inverter circuit 93. The OR circuit 90 is a circuit that outputs the set pulse signal S1, and outputs a pulse signal S5*a* or the set pulse signal Sb as the set pulse signal S1.

The OR circuit 91 is a circuit that outputs the reset pulse signal S2, and outputs a pulse signal S5*b* or the reset pulse signal Sc as the reset pulse signal S2.

The AND circuit 92 is a circuit that outputs a pulse signal S5*a*, and outputs the pulse signal S5 from the detection circuit 41 as the pulse signal S5*a* when the control signal S0 is high.

The inverter circuit 93 is a circuit that inverts the logic level of the control signal S0, and outputs a resultant signal as a control signal S0*a*. The AND circuit 94 is a circuit that outputs the pulse signal S5*b*, and outputs the pulse signal S5 as the pulse signal S5*b* when the control signal S0*a* is high (i.e., the control signal S0 is low).

Note that the OR circuits 90, 91, the AND circuits 92, 94, and the inverter circuit 93 operate based on the power supply voltage Vreg, and thus each of the set pulse signal S1 and the reset the pulse signal S2 according to an embodiment of the present disclosure is a pulse signal whose amplitude level changes in a range from 0 V to the level of the power supply voltage Vreg (for example, 5 V).

The level shifter circuit 43 in FIG. 1 is a circuit that shifts the level of each of the set pulse signal S1 and the reset pulse signal S2 to a level at which the driver circuit 45 can identify. Specifically, the level shifter circuit 43 shifts the level of the set pulse signal S1, and outputs a set pulse signal S3 with an amplitude level of several tens of volts with reference to the voltage Vs which serves as a high-side reference potential, for example. Further, the level shifter circuit 43 shifts the level of the reset pulse signal S2 and outputs a reset pulse signal S4 with an amplitude level of several tens of volts, for example, with reference to the voltage Vs.

<<<<Example of Level Shifter Circuit 43>>>

Figure 8:
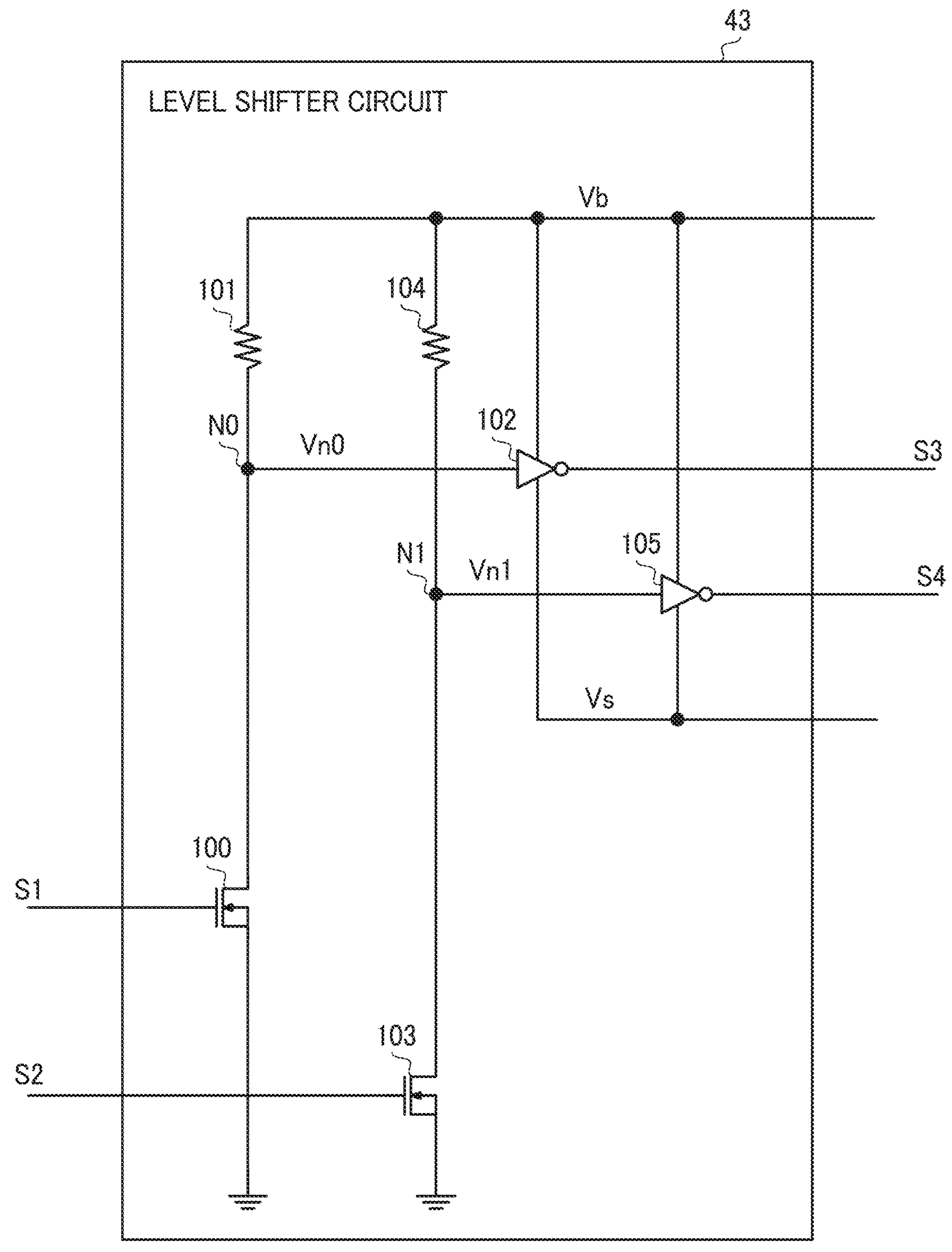
FIG. 8 is a diagram illustrating an example of a level shifter circuit 43.

As illustrated in FIG. 8, the level shifter circuit 43 includes NMOS transistors 100, 103, resistors 101, 104, and inverter circuits 102, 105. The NMOS transistor 100 is an element that identifies the set pulse signal S1, and in response to turning on of the NMOS transistor 100, a voltage Vn0 at a connection point NO between the NMOS transistor 100 and the resistor 101 with one end having received the voltage Vb reaches the ground voltage level. Meanwhile, in response to turning off of the NMOS transistor 100, the voltage Vn0 reaches the level of the voltage Vb.

The inverter circuit 102 is an element that outputs the set pulse signal S3, based on the voltage Vn0, and operates based on the voltage Vb with reference to the voltage Vs. Accordingly, upon receiving the voltage Vn0 at the ground voltage level, the inverter circuit 102 outputs the set pulse signal S3 at the level of the voltage Vb. Meanwhile, upon receiving the voltage Vn0 at the level of the voltage Vb, the inverter circuit 102 outputs the set pulse signal S3 at the level of the voltage Vs.

The NMOS transistor 103 is an element that identifies the set pulse signal S2, and in response to turning on of the NMOS transistor 103, the voltage Vn1 at a connection point N1 between the NMOS transistor 103 and the resistor 104 with one end having received the voltage Vb reaches the ground voltage level. Meanwhile, in response to turning off of the NMOS transistor 103, the voltage Vn1 reaches the level of voltage Vb.

The inverter circuit 105 is an element that outputs the reset pulse signal S4, based on the voltage Vn1, and operates based on the voltage Vb with reference to the voltage Vs. Accordingly, upon receiving the voltage Vn1 at the ground voltage level, the inverter circuit 105 outputs the reset pulse signal S4 at the level of the voltage Vb. Meanwhile, upon receiving the voltage Vn1 at the level of the voltage Vb, the inverter circuit 105 outputs the reset pulse signal S4 at the level of the voltage Vs. Note that the NMOS transistor 100 corresponds to a "first transistor", and t NMOS transistor 103 corresponds to a "second transistor".

The charge pump circuit 44 in FIG. 1 generates the bootstrap voltage Vb for charging the capacitor 22, based on the power supply voltage Vcc (for example, "20 V") that is applied to the terminal VCC.

The driver circuit 45 is a circuit that turns on the high-side IGBT 30 in response to the set pulse signal S3, and turns off the IGBT 30 in response to the reset pulse signal S4. Specifically, the driver circuit 45 outputs a drive signal Vdr1 at the level of the voltage Vb to the gate electrode of the IGBT 30 through the terminal HO, in response to the set pulse signal S3. As a result, the IGBT 30 is turned on. Meanwhile, upon receiving the reset pulse signal S4, the driver circuit 45 outputs the drive signal Vdr1 at the level of the voltage Vs to the gate electrode of the IGBT 30 through the terminal HO. As a result, the IGBT 30 is turned off.

The driver circuit 46 is a circuit that drives the low-side IGBT 31 in response to the control signal S0. Specifically, the driver circuit 46 outputs a high drive signal Vdr1 to the gate electrode of the IGBT 31 through the terminal LO, in response to the low control signal S0. As a result, the IGBT 31 is turned on. Meanwhile, the driver circuit 46 outputs a low drive signal Vdr2 to the gate electrode of the IGBT 31 through the terminal LO, in response to a high control signal S0. As a result, the IGBT 31 is turned off. Note that the driver circuit 46 operates based on the power supply voltage Vcc. Further, the driver circuit 45 corresponds to a "first driver circuit" and the driver circuit 46 corresponds to a "second driver circuit".

<<<Operation Example of Switching Control IC 20>>>

Figure 9:
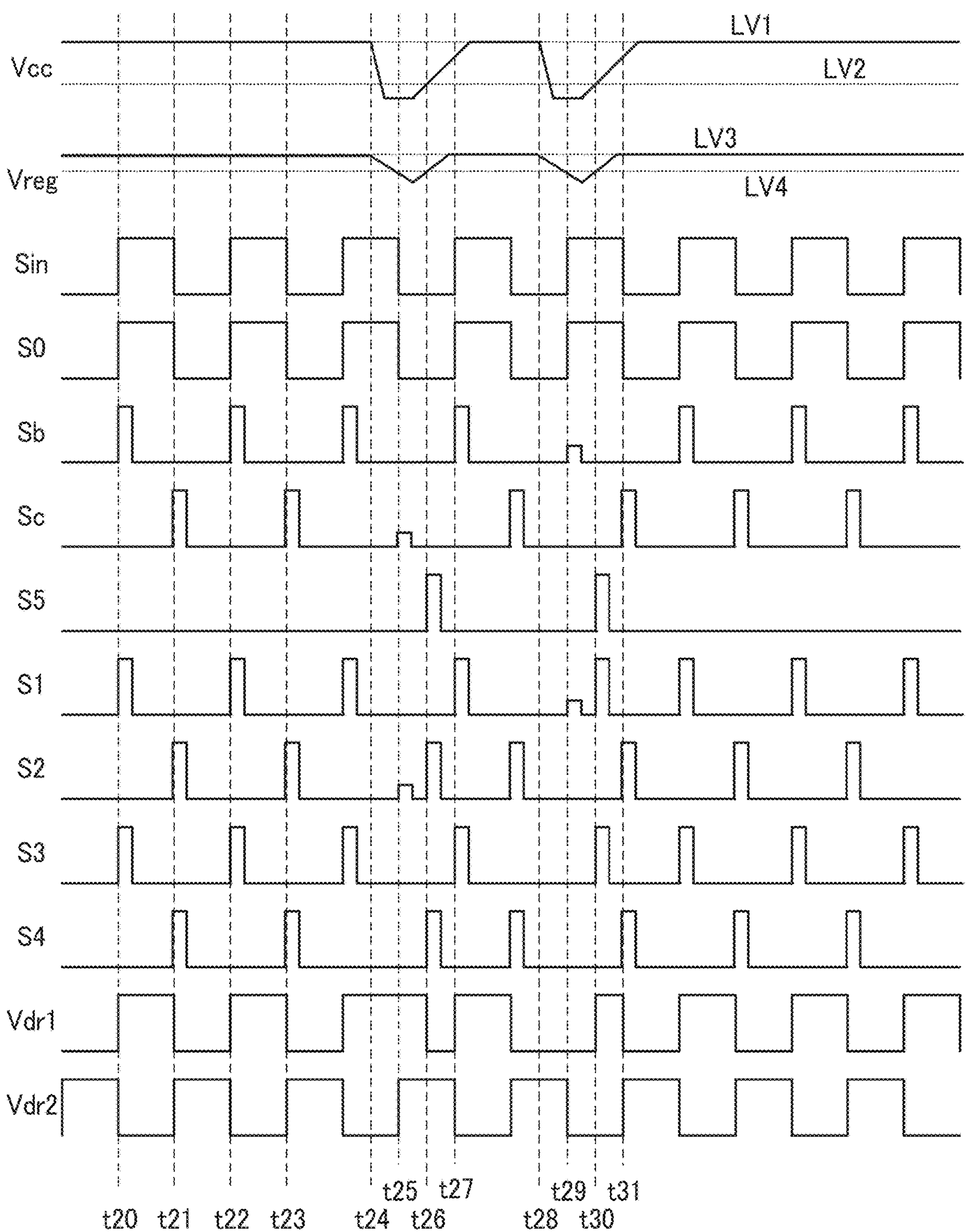
FIG. 9 is a diagram illustrating an operation example of a switching control IC 20.

FIG. 9 is a diagram illustrating an operation example of the switching control circuit IC 20. At time t20, upon receiving a high input signal Sin, the pulse generating circuit 82 in FIG. 6 outputs the pulse signal Sb. Then, the output circuit 83 in FIG. 6 outputs the set pulse signal S1, and the level shifter circuit 43 in FIG. 8 outputs the set pulse signal S3. Thus, the driver circuit 45 outputs the drive signal Vdr1 at the level of the voltage Vb, to thereby turn on the IGBT 30. Meanwhile, the driver circuit 46 outputs the low drive signal Vdr2 in response to the input signal Sin, to thereby turn off the IGBT 31.

At time t21, in response to a low input signal Sin being inputted, the pulse generating circuit 82 outputs the pulse signal Sc. Then, the output circuit 83 outputs the reset pulse signal S2, and the level shifter circuit 43 outputs the reset pulse signal S4. Thus, the driver circuit 45 outputs the drive signal Vdr1 at the level of the voltage Vs, to thereby turn off the IGBT 30. Meanwhile, the driver circuit 46 outputs a high drive signal Vdr2 in response to the input signal Sin, to thereby turn on the IGBT 31. The same operation is repeated from time t22 until just before time t24.

At time t24, upon a drop in the power supply voltage Vcc, the power supply voltage Vreg also starts to drop accordingly.

At time t25, in response to the power supply voltage Vreg having been lowering when the low input signal Sin is inputted, the pulse generating circuit 82 outputs the pulse signal Sc at the level corresponding to that of the power supply voltage Vreg.

Further, since the power supply voltage Vreg is low, the output circuit 83 outputs the reset pulse signal S2 having a lowered voltage level. Thus, the NMOS transistor 103 of the level shifter circuit 43 is not turned on by the reset pulse signal S2, and the level shifter circuit 43 cannot output the reset pulse signal S4. Accordingly, the IGBT 30 is not turned off.

In such a state, if the driver circuit 46 turns on the IGBT 31 in response to the input signal Sin, a through current will flow through the half-bridge circuit 21, and the IGBTs 30, 31 may be broken. Thus, in response to the power supply voltage Vcc being restored to the second level LV2, the switching control IC 20 according to an embodiment of the present disclosure turns off the IGBT 30, shuts off the through current, thereby suppressing breakage of the IGBTs 30, 31.

At time t26, in response to the power supply voltage Vcc being restored to the second level LV2, the detection circuit 41 outputs the pulse signal S5, and the output circuit 83 outputs the pulse signal S5 as the reset pulse signal S2, since the pulse signal S5 is outputted when the signal S0 is low. Then, the level shifter circuit 43 outputs the reset pulse signal S4, and the IGBT 30 is turned off.

At time t27, upon receiving the high input signal Sin, the switching control IC 20 operates in the same manner as at time t20.

At time t28, upon a drop in the power supply voltage Vcc, the power supply voltage Vreg also starts to drop accordingly.

At time t29, in response to the power supply voltage Vreg having been lowering when the high input signal Sin is inputted, the pulse generating circuit 82 outputs the pulse signal Sb of the level corresponding to the power supply voltage Vreg. However, the output circuit 83 outputs the set pulse signal S1 having a lowered voltage level because the power supply voltage Vreg is low. Thus, the NMOS transistor 100 of the level shifter circuit 43 is not turned on by the set pulse signal S1, and the level shifter circuit 43 cannot output the set pulse signal S3. Accordingly, the IGBT 30 is not turned on.

As such, the switching control IC 20 results in being unable to turn on the IGBT 30 at the timing at which the high input signal Sin is inputted and the IGBT 30 is to be turned on. Accordingly, the switching control IC 20 may cause a malfunction, if the power supply voltage Vcc drops at the timing at which the IGBT 30 is to be turned on. Thus, in response to the power supply voltage Vcc being restored to the second level LV2, the switching control IC 20 according to an embodiment of the present disclosure turns on the IGBT 30, to thereby suppress a malfunction.

At time t30, when the power supply voltage Vcc is restored to the second level LV2, the detection circuit 41 outputs the pulse signal S5, and the output circuit 83 outputs the pulse signal S5 as the set pulse signal S1, since the pulse signal S5 was outputted when the signal S0 was high. Then, the level shifter circuit 43 outputs the set pulse signal S3, and the IGBT 30 is turned on.

At time t31, upon receiving the low input signal Sin, the switching control IC 20 operates in the same manner as at time t21.

With the switching control IC 20 operating as described above, it is possible to suppress the through current and malfunction. This makes it possible to provide a switching control circuit that safely controls switching of a switching device even when the power supply voltage drops.

===Modification===

In the description having been given above, a drop in the power supply voltage Vcc from the first level LV1 and a rise to the second level LV2 may be detected by a change in a numerical value that increases or decreases in correlation with the power supply voltage Vcc. For example, as illustrated in FIGS. 3, 5, and 9, the level of the power supply voltage Vcc may be detected based on the power supply voltage Vreg rising to the fourth level LV4 after dropping below the third level LV3.

SUMMARY

The power module 10 according to an embodiment of the present disclosure has been described above. The switching control IC 20 includes the power supply circuit 40, the detection circuit 41, the signal output circuit 42, the level shifter circuit 43, and the driver circuit 45, and the signal output circuit 42 outputs the reset pulse signal S1 in response to the power supply voltage Vcc being restored to the second level LV2. This makes it possible to provide a switching control circuit that safely controls switching of the switching device even when the power supply voltage drops.

Further, the signal output circuit 42 outputs the set pulse S2, in response to the power supply voltage Vcc being restored to the second level LV2. This makes it possible to provide the switching control circuit that suppresses a malfunction even when the power supply voltage drops.

Further, the detection circuit 41 includes the voltage detection circuit 50 and the additional pulse generating circuit 51, and the signal output circuit 42 outputs the pulse signal S5 as the set pulse signal S1 or the reset pulse signal S2, in response to the input signal Sin. This makes it possible to suppress a malfunction, thereby being able to control the power module 10 more safely.

Further, the level shifter circuit 43 includes the NMOS transistors 100, 103, and the threshold value level of each thereof is lower than the second level LV2. This causes the detection circuit 41 to generate the pulse signal S5 when the voltage level of the power supply voltage Vcc reaches the second level LV2, thereby being able to turn on and off the IGBT 30 more reliably.

Further, the switching control IC 20 includes the driver circuit 46. Accordingly, in response to the power supply voltage Vcc being restored to the second level LV2, the IGBT 30 is turned off, to thereby shut off the through current, which suppresses breakage of the IGBTs 30, 31.

Further, the detection circuit 41 detects a change in the power supply voltage Vcc, using a change in a numerical value correlated with the power supply voltage Vcc. This enables the detection circuit 41 to detect a change in the power supply voltage Vcc, using not only the power supply voltage Vcc, but also another numerical value correlated with the power supply voltage Vcc.

Further, the numerical value correlated with the power supply voltage Vcc may be the power supply voltage Vreg. This makes it possible to suppress a malfunction through detection of the power supply voltage Vreg as well.

The present disclosure is directed to provision of a switching control circuit that safely controls switching of a switching device even when a power supply voltage drops.

According to the present disclosure, it is possible to provide a switching control circuit that safely controls switching of a switching device even when a power supply voltage drops.

An embodiment of the present disclosure described above is simply to facilitate understanding of the present disclosure and is not in any way to be construed as limiting the present disclosure. The present disclosure may variously be changed or altered without departing from its essential features and encompass equivalents thereof.

What is claimed is:

1. A switching control circuit for controlling a first switching device, the switching control circuit comprising:

a signal output circuit configured to output a set signal to turn on the first switching device, in response to a logic level of an input signal of the switching control circuit reaching a first logic level, and output a reset signal to turn off the first switching device, in response to the logic level of the input signal reaching a second logic level;

a level shifter circuit configured to shift a level of each of the set signal and the reset signal;

a first driver circuit configured to drive the first switching device, in response to an output from the level shifter circuit;

a power supply circuit configured to generate a second power supply voltage for the signal output circuit, based on a first power supply voltage; and a detection circuit configured to detect that the first power supply voltage, after dropping from a first level, has risen to a second level, wherein the signal output circuit is configured to output the reset signal, in response to the first power supply voltage being restored to the second level after dropping from the first level, when the logic level of the input signal is the second logic level, the level of each of the set signal and the reset signal changes according to the level of the second power supply voltage, and the level shifter circuit is configured to identify the reset signal upon the reset signal being outputted when the first power supply voltage is at or above the second level.

2. The switching control circuit according to claim 1, wherein the signal output circuit outputs the set signal, in response to the first power supply voltage being restored to the second level after dropping from the first level, when the logic level of the input signal is the first logic level, and the level shifter circuit identifies the set signal upon the set signal being outputted when the first power supply voltage is at or above the second level.

3. The switching control circuit according to claim 2, wherein the detection circuit includes a voltage detection circuit configured to output a signal corresponding to the first power supply voltage, in response to the first power supply voltage being restored after dropping, and a pulse generating circuit configured to generate a pulse signal, in response to the first power supply voltage being restored to the second level after dropping, based on the second power supply voltage and the signal outputted from the voltage detection circuit, and the signal output circuit outputs the pulse signal as the set signal or the reset signal, based on the input signal.

4. The switching control circuit according to claim 3, wherein the level shifter circuit includes a first transistor to receive the set signal, and a second transistor to receive the reset signal, and a threshold value level of each of the first transistor and the second transistor is lower than a level of the second power supply voltage when the first power supply voltage is at or above the second level.

5. The switching control circuit according to claim 1, wherein the first switching device is on a high potential side, the switching control circuit is further configured to control a second switching device that is on a ground side and is connected to the first switching device, and the switching control circuit further includes a second driver circuit configured to drive the second switching device in response to the input signal.

6. The switching control circuit according to claim 1, wherein the detection circuit detects a change in the first power supply voltage, using a change in a numerical value correlated with the first power supply voltage.

7. The switching control circuit according to claim 6, wherein the numerical value correlated with the first power supply voltage is the second power supply voltage.

8. A semiconductor device comprising:

a first switching device and a second switching device, and a switching control circuit configured to control switching of the first switching device and the second switching device, the switching control circuit including a signal output circuit configured to output a set signal to turn on the first switching device, in response to a logic level of an input signal of the switching control circuit reaching a first logic level, and output a reset signal to turn off the first switching device, in response to the logic level of the input signal reaching a second logic level, a level shifter circuit configured to shift a level of each of the set signal and the reset signal, a first driver circuit configured to drive the first switching device, in response to an output from the level shifter circuit, a power supply circuit configured to generate a second power supply voltage for the signal output circuit, based on a first power supply voltage, and a detection circuit configured to detect that the first power supply voltage, after dropping from a first level, has risen to a second level, wherein the signal output circuit is configured to output the reset signal, in response to the first power supply voltage being restored to the second level after dropping from the first level, when the logic level of the input signal is the second logic level, the level of each of the set signal and the reset signal changes according to the level of the second power supply voltage, and the level shifter circuit is configured to identify the reset signal upon the reset signal being outputted when the first power supply voltage is at or above the second level.

9. The semiconductor device according to claim 8, wherein the detection circuit detects a change in the first power supply voltage, using a change in a numerical value correlated with the first power supply voltage.

10. The semiconductor device according to claim 9, wherein the numerical value correlated with the first power supply voltage is the second power supply voltage.

* * * * *